United States Patent
Bhatti et al.

(10) Patent No.: US 7,184,735 B2
(45) Date of Patent: Feb. 27, 2007

(54) RADIO FREQUENCY INTEGRATED CIRCUIT HAVING SYMMETRICAL DIFFERENTIAL LAYOUT

(75) Inventors: Iqbal S. Bhatti, Los Angeles, CA (US); Rozi (Razieh) Roufoogaran, Marina Del Rey, CA (US)

(73) Assignee: Broadcom Corporation, Irvine, CA (US)

( * ) Notice: Subject to any disclaimer, the term of this patent is extended or adjusted under 35 U.S.C. 154(b) by 689 days.

(21) Appl. No.: 10/645,026

(22) Filed: Aug. 21, 2003

(65) Prior Publication Data

US 2005/0043006 A1 Feb. 24, 2005

(51) Int. Cl.
*H04B 1/18* (2006.01)
(52) U.S. Cl. .................... 455/292; 455/334
(58) Field of Classification Search ........... 455/292, 455/293, 334, 73, 550.1, 127.1, 280; 330/252
See application file for complete search history.

(56) References Cited

U.S. PATENT DOCUMENTS 6,714,169 B1* 3/2004 Chau et al. ................. 343/876
6,856,199 B2* 2/2005 Komijani et al. ........... 330/276
6,870,513 B2* 3/2005 Deng et al. ................. 343/795
2004/0253939 A1* 12/2004 Castaneda et al. .......... 455/341
2005/0090287 A1* 4/2005 Rofougaran ............. 455/562.1

* cited by examiner

*Primary Examiner*—Nguyen T. Vo
(74) *Attorney, Agent, or Firm*—Garlick Harrison & Markison; Timothy W. Markison

(57) ABSTRACT

A radio frequency circuit includes a first differential RF path and a second differential path. The first differential RF path includes at least one RF block that includes a first differential section and a second differential section, wherein the first differential section is symmetrical with the second differential section. The second differential RF path includes at least one RF block that includes a first differential section and a second differential section, wherein the first differential section is symmetrical with the second differential section. The first and second half differential sections of the at least one RF block of the first differential RF path are symmetrically placed on at least one layer around the first and second half differential sections of the at least one RF block of the second differential RF path, wherein the first and second half differential sections of the at least one RF block of the second differential RF path are fabricated on the at least one layer.

14 Claims, 6 Drawing Sheets

LNA 72

PA 84

RADIO FREQUENCY INTEGRATED CIRCUIT HAVING SYMMETRICAL DIFFERENTIAL LAYOUT

This patent claims priority under 35 USC §120 to co-pending patent application entitled AN INTEGRATED CIRCUIT RADIO FRONT-END ARCHITECTURE AND APPLICATIONS THEREOF, having a filing date of Jun. 12, 2003, and a Ser. No. of 10/459,985.

BACKGROUND OF THE INVENTION

1. Technical Field of the Invention

This invention relates generally to communication systems and, more particularly, to radio receivers and transmitters used within such communication systems.

2. Description of Related Art

Communication systems are known to support wireless and wire-lined communications between wireless and/or wire-lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera, communicates directly or indirectly with other wireless communication devices. For direct communications (also known as point-to-point communications), the participating wireless communication devices tune their receivers and transmitters to the same channel or multiple channels (e.g., one or more of the plurality of radio frequency (RF) carriers of the wireless communication system) and communicate over that channel or channels. For indirect wireless communications, each wireless communication device communicates directly with an associated base station (e.g., for cellular services) and/or an associated access point (e.g., for an in-home or in-building wireless network) via an assigned channel, or channels. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, demodulates the RF carrier frequency from the RF signals via one or more intermediate frequency stages to produce baseband signals, and demodulates the baseband signals in accordance with a particular wireless communication standard to recapture the transmitted data. The transmitter converts data into RF signals by modulating the data in accordance with the particular wireless communication standard to produce baseband signals and mixes the baseband signals with an RF carrier in one or more intermediate frequency stages to produce RF signals.

To recapture data from RF signals, a receiver includes a low noise amplifier, down conversion module and demodulation module. To convert data into RF signals, a transmitter includes a power amplifier, an up-conversion module and a modulation module. For radio frequency integrated circuits (RFICs), it is desirable to provide the low noise amplifier and the power amplifier with differential RF signals, instead of single-ended RF signals, to improve noise performance and common mode rejection. To convert received single-ended RF signals into differential RF signals for a receiver, and to combine differential RF signals into single-ended signals for a transmitter, a receiver and/or transmitter includes a balun (i.e., a balanced/unbalanced transformer).

Until very recently, the baluns were off-chip, i.e., on the printed circuit board, and were typically implemented in the form of micro-strip lines. However, for semiconductor chip designs, it is desirable to place RFIC baluns on-chip to reduce the cost of off-chip printed circuit board components. Recent attempts to integrate a balun onto a radio frequency integrated circuit have had limited success. For example, parallel winding, inter-wound winding, overlay winding, single planar, square wave winding, and concentrical spiral winding on-chip baluns have been tried with limited success. Each of these on-chip baluns suffers from one or more of: low quality factor, (which causes the balun to have a relatively large noise figure and large energy loss); too low of a coupling coefficient (which results in the inductance value of the balun not significantly dominating the parasitic capacitance making impedance matching more complex); asymmetrical geometry (which results in degradation of differential signals); and a relatively high impedance ground connection at the operating frequency.

Another issue with an on-chip balun is the layout of the differential circuitry of a low noise amplifier of the receiver and the differential circuitry of a power amplifier of the transmitter. As is know, to obtain the desired benefits of an on-chip balun, not only do the windings of the on-chip balun need to be symmetrical, but so do the connections to the differential circuitry of the low noise amplifier and the power amplifier.

Therefore, a need exists for an integrated radio frequency (RF) integrated circuit (IC) that includes a symmetrical layout of at least a portion of the differential receiver path and of the differential transmitter path of the RFIC.

BRIEF SUMMARY OF THE INVENTION

The radio frequency circuit of the present invention substantially meets these needs and others. In one embodiment, a radio frequency circuit includes a first differential RF path and a second differential path. The first differential RF path includes at least one RF block (e.g., a low noise amplifier, a down-conversion mixer, and/or a low intermediate frequency bandpass filter). The at least one RF block of the first differential RF path includes a first differential section and a second differential section, wherein the first differential section is symmetrical with the second differential section. The second differential RF path includes at least one RF block (e.g., a power amplifier, an up-conversion mixer, and/or a low intermediate frequency bandpass filter). The at least one RF block of the second differential RF path includes a first differential section and a second differential section, wherein the first differential section is symmetrical with the second differential section. The first and second half differential sections of the at least one RF block of the first differential RF path are symmetrically placed on at least one layer around the first and second half differential sections of the at least one RF block of the second differential RF path, wherein the first and second half differential sections of the at least one RF block of the second differential RF path are fabricated on the at least one layer. The radio frequency circuit may be implemented as an integrated circuit or as discrete components on a printed circuit board to obtain a symmetrical layout of at least a portion of the differential receiver path and of the differential transmitter path of the radio frequency circuit.

In another embodiment, a high-speed differential data circuit includes a first differential data path and a second differential data path. The first differential data path includes at least one data block, wherein the at least one data block of the first differential path includes a first differential section and a second differential section. The first differential section of the at least one data block of the first differential data path is symmetrical with the second differential section of the at least one data block of the first differential data path. The second differential data path includes at least one data block, wherein the at least one data block of the second differential data path includes a first differential section and a second differential section. The first differential section of the at least one data block of the second differential data path is symmetrical with the second differential section of the at least one data block of the second differential data path. The first and second half differential sections of the at least one data block of the first differential data path are symmetrically placed on at least one layer around the first and second half differential sections of the at least one data block of the second differential data path, wherein the first and second half differential sections of the at least one data block of the second differential data path are fabricated on the at least one layer. Such a high-speed data circuit may be implemented on an integrated circuit and/or on a printed circuit board.

DETAILED DESCRIPTION OF THE INVENTION

Figure 1:
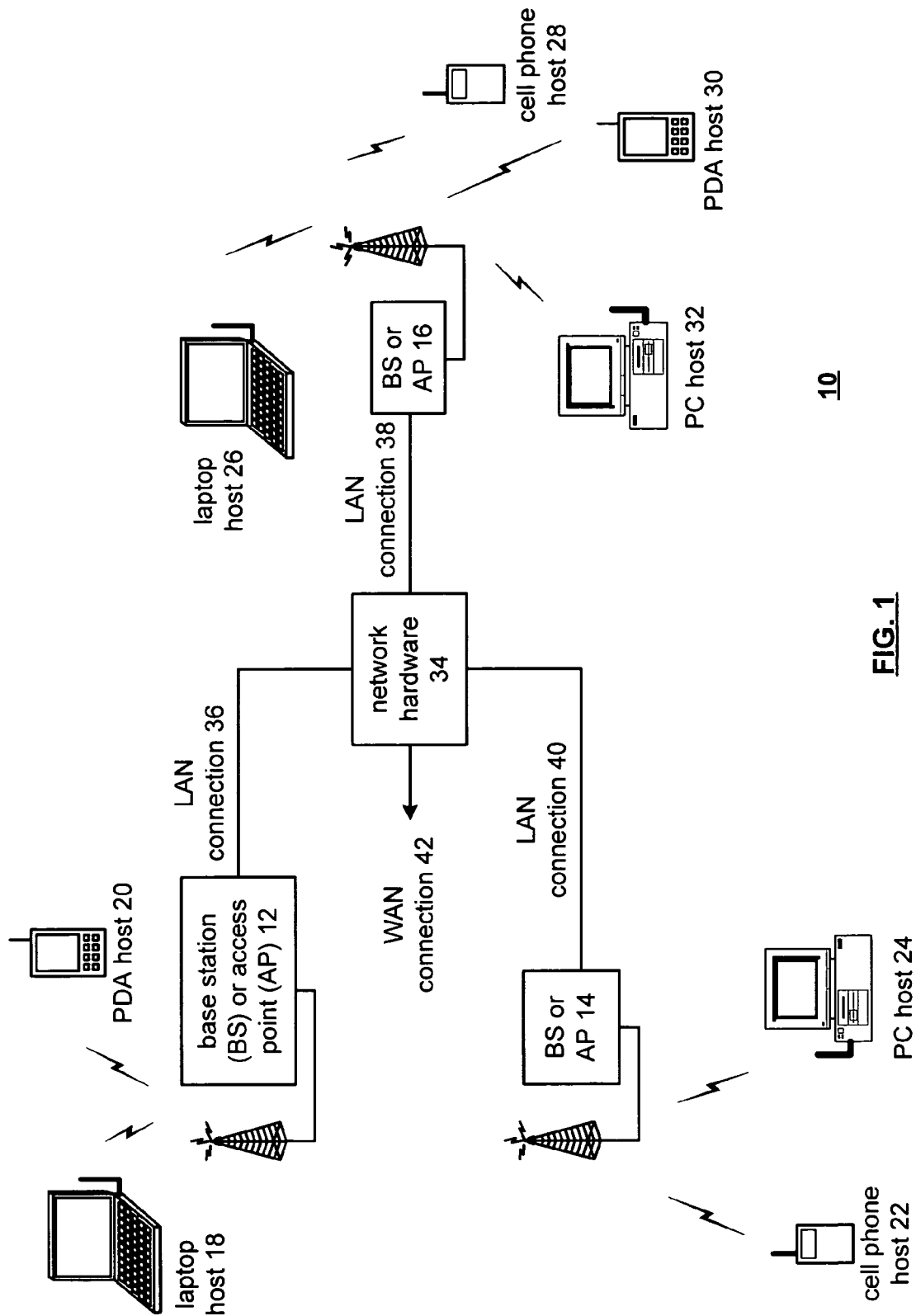
FIG. 1 is a schematic block diagram of a wireless communication system in accordance with the present invention.

FIG. 1 illustrates a schematic block diagram of a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12 are operably coupled to the network hardware 34 via local area network connections 36, 38 and 40. The network hardware 34, which may be a router, switch, bridge, modem, system controller, et cetera, provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes an integrated RF front-end architecture as disclosed herein to enhance performance of radio frequency integrated circuits.

Figure 2:
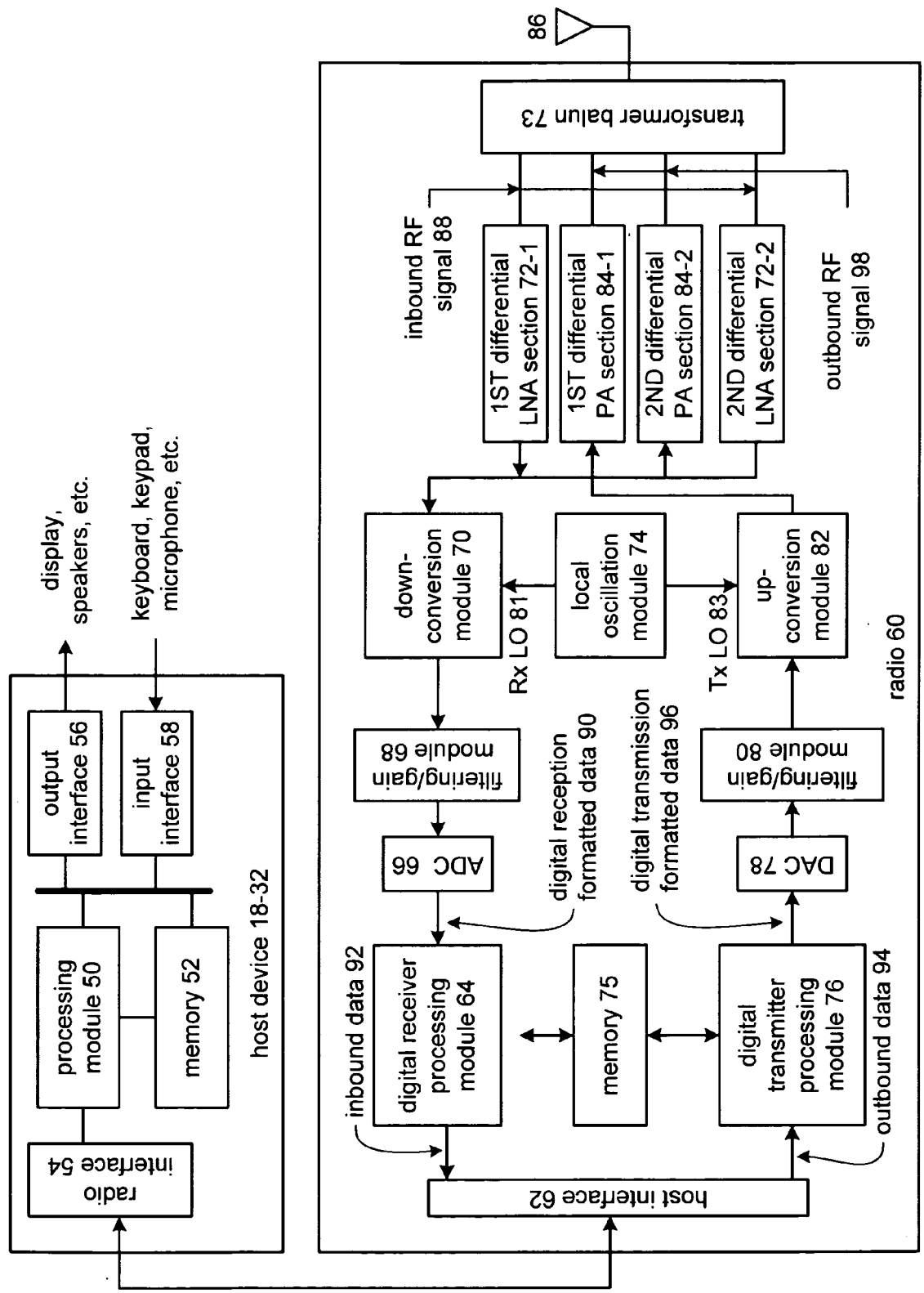
FIG. 2 is a schematic block diagram of a wireless communication device in accordance with the present invention.

FIG. 2 illustrates a schematic block diagram of a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera, such that the received data may be displayed. The radio interface 54 also provides outbound data from the processing module 50 to the radio 60. The processing module 50 may receive the outbound data from an input device such as a keyboard, keypad, microphone, et cetera, via the input interface 58 or generate the data itself. For data received via the input interface 58, the processing module 50 may perform a corresponding host function on the data and/or route it to the radio 60 via the radio interface 54.

Radio 60 includes a host interface 62, a receiver section, a transmitter section, local oscillation module 74, a transformer balun 73, and an antenna 86. The receiver section includes a digital receiver processing module 64, analog-to-digital converter 66, filtering/gain module 68, down conversion module 70, a low noise amplifier 72, which includes a first differential section 72-1 and a second differential section 72-2, and at least a portion of memory 75. The transmitter section includes a digital transmitter processing module 76, digital-to-analog converter 78, filtering/gain module 80, up-conversion module 82, a power amplifier 84 that includes a first differential section 84-1 and a second differential section 84-2, and at least a portion of memory 75. The transformer balun 73 may be implemented in accordance with the teachings of co-pending patent application entitled ON-CHIP TRANSFORMER BALUN, having a filing date of Jan. 23, 2002, and a Ser. No. of 10/055,425.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF will be in the frequency range of zero to a few megahertz.

The digital-to-analog converter 78 converts the digital transmission formatted data 96 from the digital domain to the analog domain. The filtering/gain module 80 filters and/or adjusts the gain of the analog signal prior to providing it to the up-conversion module 82. The up-conversion module 82 directly converts the analog baseband or low IF signal into an RF signal based on a transmitter local oscillation provided by local oscillation module 74. The power amplifier 84 amplifies the RF signal to produce outbound RF signal 98 and routes the outbound RF signal 98 to the antenna 86. The antenna 86 transmits the outbound RF signal 98 to a targeted device such as a base station, an access point and/or another wireless communication device.

The radio 60 also receives, via the antenna 86, an inbound RF signal 88, which can be transmitted by a base station, an access point, or another wireless communication device. The antenna 86 provides the inbound RF signal 88 to the low noise amplifier 72, which amplifies the signal 88 to produce an amplified inbound RF signal. The low noise amplifier 72 provides the amplified inbound RF signal to the down conversion module 70, which directly converts the amplified inbound RF signal into an inbound low IF signal based on a receiver local oscillation provided by local oscillation module 74. The down conversion module 70 provides the inbound low IF signal to the filtering/gain module 68, which filters and/or adjusts the gain of the signal before providing it to the analog to digital converter 66.

The analog-to-digital converter 66 converts the filtered inbound low IF signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

The transformer balun 73, which may be fabricated on-chip or may be a separate device that is off-chip, includes four secondary taps. The two outer taps couple to the differential sections of the low noise amplifier 72 and the inner two taps coupled to the differential sections of the power amplifier 84. As shown, the low noise amplifier 72 includes a first differential section 72-1 and a second differential section 72-2, which will be described in greater detail with reference to FIG. 5. The power amplifier 84 includes a first differential section 84-1 and a second differential section 84-2, which will be described in greater detail with reference to FIG. 6. To maintain a substantially symmetrical connection between the transformer balun 73 and the differential sections of the power amplifier 84 and the low noise amplifier 72, the differential sections of the low noise amplifier 84-1 are symmetrically placed on the IC layout around the symmetrical differential sections of the power amplifier 72. The differential sections of the low noise amplifier 72 and the power amplifier 84 may be fabricated on a single metal layer of an integrated circuit or on multiple metal layers of an integrated circuit. Alternatively, the power amplifier and the low noise amplifier may be discrete components symmetrically laid out on a printed circuit board.

As one of average skill in the art will appreciate, the radio may be implemented in a variety of ways to receive RF signals and to transmit RF signals and may be implemented using a single integrated circuit or multiple integrated circuits. Further, at least some of the modules of the radio 60 may be implemented on the same integrated circuit with at least some of the modules of the host device 18-32. Regardless of how the radio is implemented, the concepts of the present invention are applicable.

Figure 3:
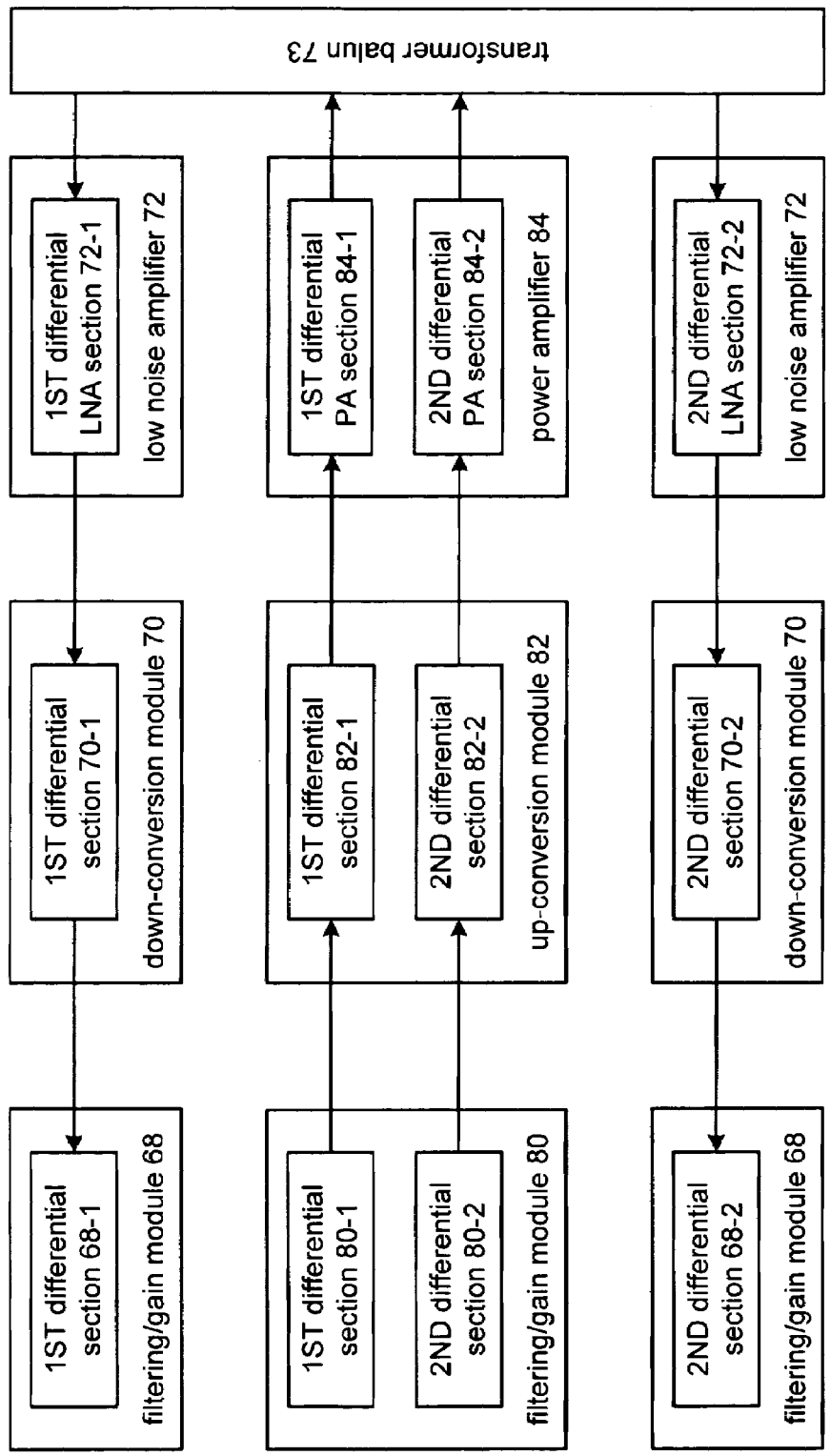
FIG. 3 is a schematic block diagram of a radio frequency circuit in accordance with the present invention.

FIG. 3 is a schematic block diagram of radio frequency circuit that includes a differential receiver section and a differential transmitter section operably coupled to a transformer balun 73, which may be on-chip or off-chip. The differential transmitter section includes a differential filter/gain module 80, a differential up-conversion module 82, and a differential power amplifier 84. The differential receiver section includes a differential filter/gain module 68, a differential down-conversion module 70, and a differential low noise amplifier 72.

As shown, the differential sections of the filter/gain module 68, the down-conversion module 70, and the low noise amplifier 72 are symmetrically laid out around the differential sections of the filter/gain module 80, the up-conversion module 82, and the power amplifier 84. In this manner, the connections to and from the transformer balun 73, the paths between the components of the transmitter section and receiver section, and the components of the transmitter and receiver sections are substantially symmetrical.

Figure 4:
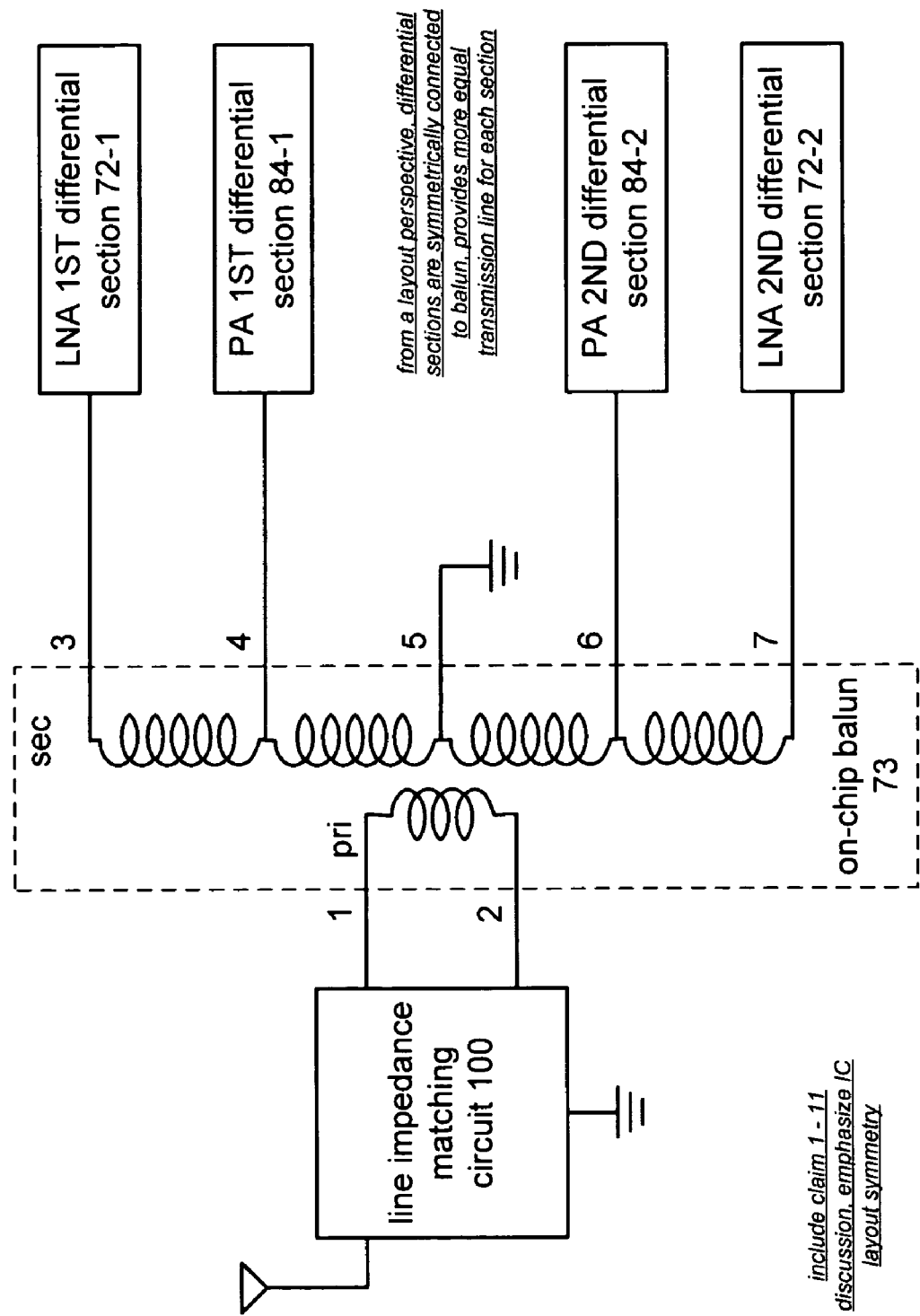
FIG. 4 is a functional layout diagram of at least a portion of the radio frequency circuit in accordance with the present invention.

FIG. 4 is a is a functional layout diagram of at least a portion of the radio frequency circuit that includes a line impedance matching circuit 100, the transformer balun 73, the differential sections of the low noise amplifier 72-1 and 72-2, and the differential sections of the power amplifier 84-1 and 84-2. As shown, the primary of the balun 73, which includes taps 1 and 2, is coupled to the impedance matching circuit 100 that provides an impedance, at the radio frequency, of approximately 50 Ohms, or as required by the antenna. The secondary of the balun 73 includes five taps. The center tap of the secondary (e.g., tap 5) is coupled to ground of the integrated circuit. Tap 3 is coupled to the first differential section of the low noise amplifier 72-1 and tap 7 is coupled to the second differential section of the low noise amplifier 72-2. Tap 4 is coupled to the first differential section of the power amplifier 84-1 and tap 6 is coupled to the second differential section of the power amplifier 84-2.

The differential sections of the power amplifier 84-1 and 84-2 are symmetrical to one another and approximately equal distance, with respect to an IC layout, to the transformer balun. The differential sections of the low noise amplifier 72-1 and 72-2 are symmetrical to one another and are approximately equal distance, with respect to an IC layout, to the transformer balun 73. The layout distance between the transformer balun 73 and the differential sections of the low noise amplifier and the power amplifier are approximately the same, thus providing symmetrical connections. To achieve the symmetrical connections, the differential sections of the low noise amplifier 72 are separated and symmetrically laid out around the differential sections of the power amplifier.

As one of average skill in the art will appreciate, a high-speed differential data circuit may be laid out to achieve symmetry as within a radio frequency integrated circuit. Such a high-speed differential data circuit includes a first differential data path and a second differential data path. The first differential data path includes at least one data block, wherein the at least one data block of the first differential path includes a first differential section and a second differential section. The first differential section of the at least one data block of the first differential data path is symmetrical with the second differential section of the at least one data block of the first differential data path. The second differential data path includes at least one data block, wherein the at least one data block of the second differential data path includes a first differential section and a second differential section. The first differential section of the at least one data block of the second differential data path is symmetrical with the second differential section of the at least one data block of the second differential data path. The first and second half differential sections of the at least one data block of the first differential data path are symmetrically placed on at least one layer around the first and second half differential sections of the at least one data block of the second differential data path, wherein the first and second half differential sections of the at least one data block of the second differential data path are fabricated on the at least one layer. Such a high-speed data circuit may be implemented on an integrated circuit and/or on a printed circuit board.

Figure 5:
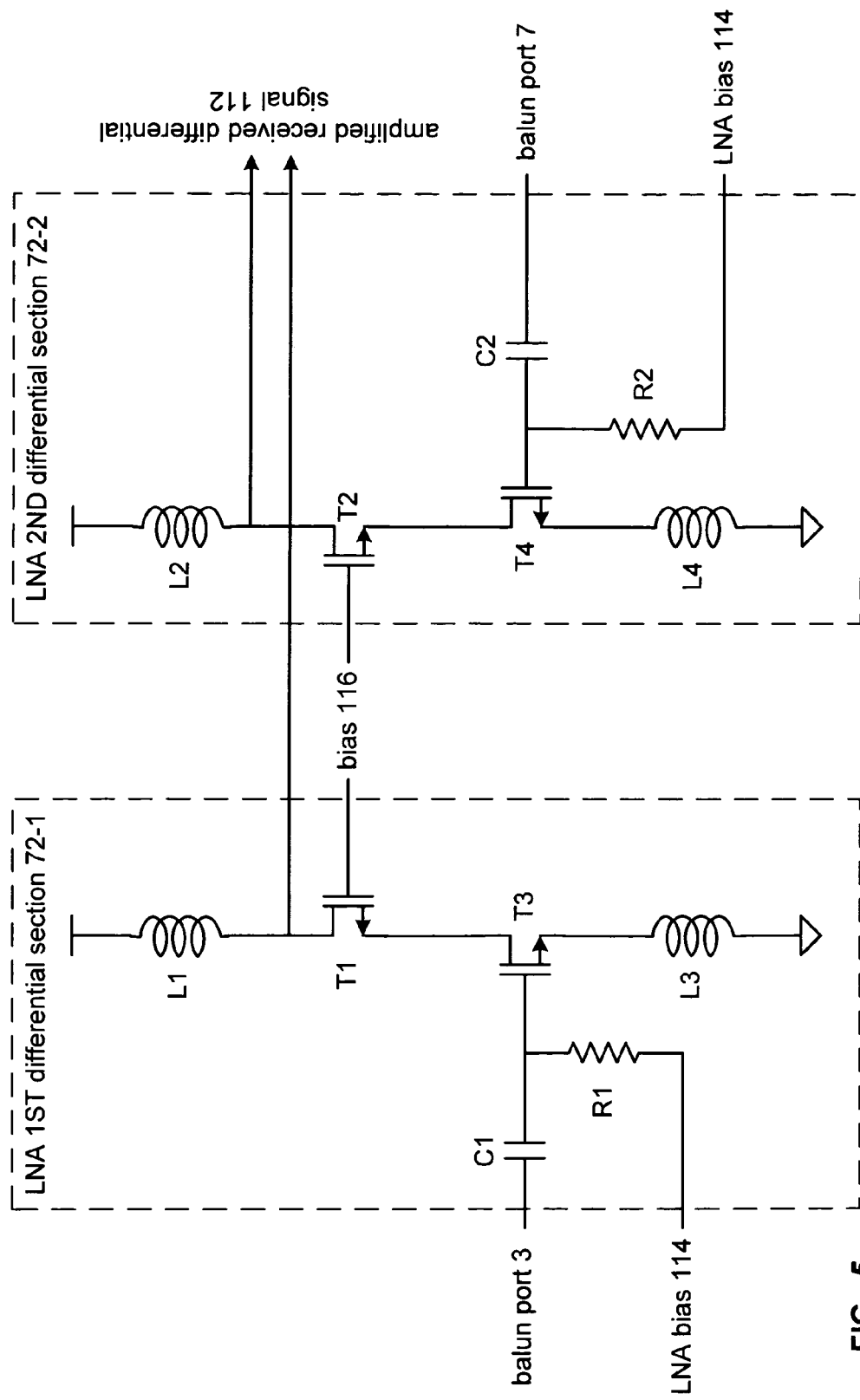
FIG. 5 is a schematic block diagram of a differential low noise amplifier in accordance with the present invention.

FIG. 5 is a schematic block diagram of a differential low noise amplifier 72 that includes the first differential section 72-1 and the second differential section 72-2. The first differential section 72-1 includes an input transistor T3, a capacitor C1, a resistor R1, a load transistor T1, an inductor L3, and a load inductor L1. The second differential section 72-2 includes identical components to the first differential section 72-1. In particular, the second differential section 72-2 includes an input transistor T4, a capacitor C2, a resistor R2, a load transistor T2, an inductor L4, and a load inductor L2. The load transistors T1 and T2 are biased via a bias voltage 116. The input transistors T3 and T4 are biased via a bias voltage 114.

In operation, received RF signals are provided from taps 3 and 7 of the transformer balun 73 to the AC coupling capacitors C1 and C2. With proper biasing of the input transistors T3 and T4 and the load transistors T1 and T2, the input transistors T3 and T4 amplify the received RF signals. The load inductors L1 and L2 provide the output 112 of the low noise amplifier 72, which is based on the current flowing through each inductor L1 and L2 in accordance with the amplifying of the received RF signals by the input transistors T3 and T4.

Because the components of the first and second sections 72-1 and 72-2 of the low noise amplifier are identical, they can be laid out in an identical manner. Further, due to the separate operation of each section 72-1 and 72-2, the sections can be physically separated on the IC layout to enable symmetrical coupling of the low noise amplifier sections to the transformer balun and symmetrical coupling of the power amplifier sections to the transformer balun.

Figure 6:
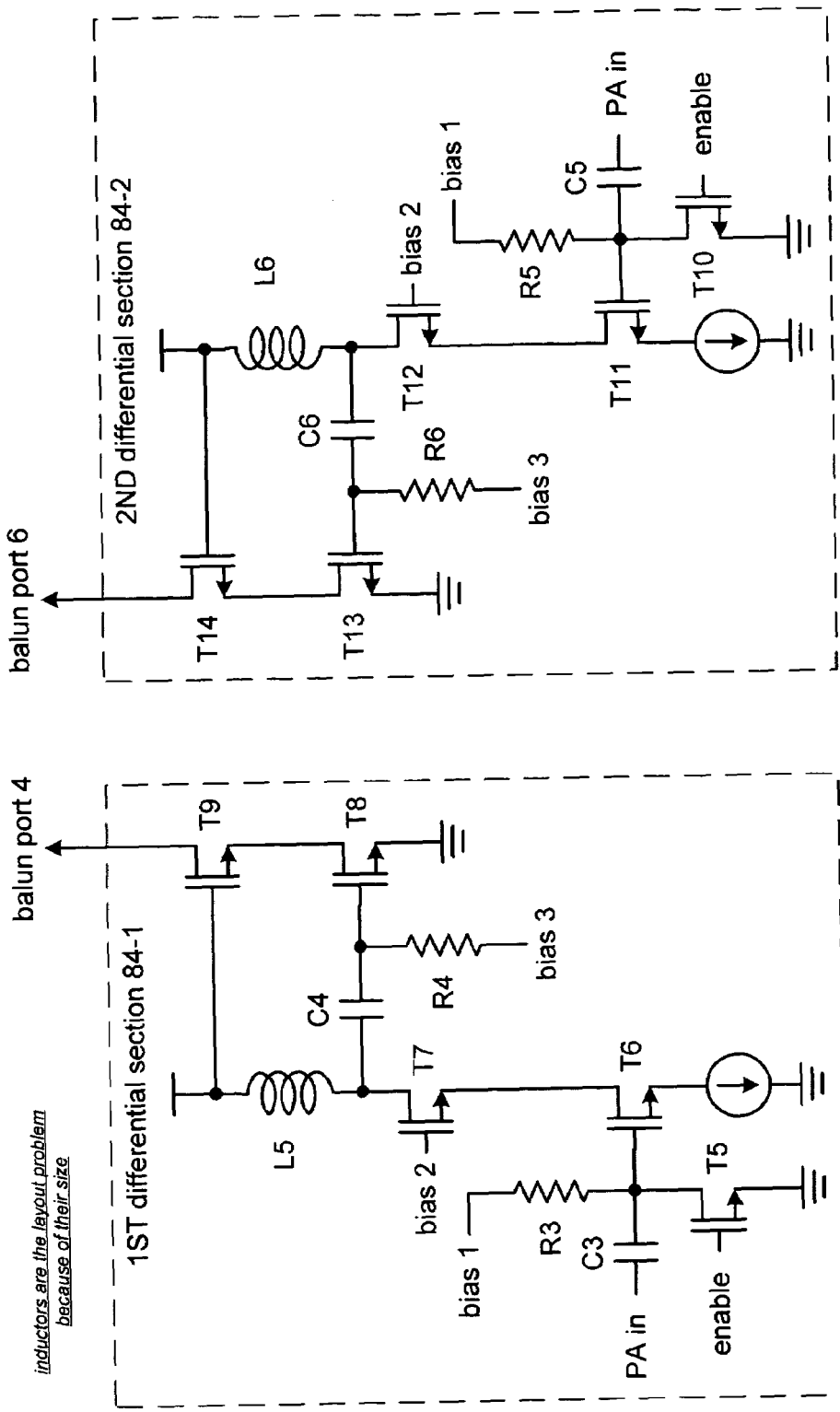
FIG. 6 is a schematic block diagram of a differential power amplifier in accordance with the present invention.

FIG. 6 is a schematic block diagram of a differential power amplifier 84 that includes the first differential section 84-1 and the second differential section 84-2. The first differential section 84-1 includes an enable transistor T5, an input transistor T6, a capacitor C3, a current source, a bias resistor R3, a load transistor T7, a load inductor L5, drive transistors T8 and T9, coupling capacitor C4 and another bias resistor R4. The second differential section 84-2 includes identical components to the first differential section 84-1. In particular, the second differential section 84-2 includes an enable transistor T5, an input transistor T6, a capacitor C3, a current source, a bias resistor R3, a load transistor T7, a load inductor L5, drive transistors T8 and T9, coupling capacitor C4 and another bias resistor R4.

In operation, RF signals for transmission are amplified by the power amplifier 84 and provided to tap 4 and tap 6 of the transformer balun 73. The power amplifier 84 receives the RF signal via capacitors C3 and C5. The input transistors T6 and T11 amplify the RF signal. The load transistors T7 and T12, along with the load inductors L5 and L6, generate a current based on the amplified RF signals produced by the input transistors T6 and T11. The drive transistors T8, T9, T13, and T14 convert the load current into a drive voltage that is provided to the transformer balun 73.

With the components of the first and second sections 84-1 and 84-2 of the power amplifier being identical, they can be laid out in an identical manner. Further, due to the separate operation of each section 84-1 and 84-2, the sections can be physically separated on the IC layout to enable symmetrical coupling of the power amplifier sections to the transformer balun and symmetrical coupling of the low noise amplifier sections to the transformer balun.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a radio frequency circuit that includes a symmetrical layout of the transmit path and the receive path. As one of average skill in the art will appreciate, other embodiments may be derived from the teachings of the present invention without deviating from the scope of the claims.

What is claimed is:

1. A radio frequency (RF) circuit comprises:
a first differential RF path having at least one RF block, wherein the at least one RF block of the first differential RF path includes a first differential section and a second differential section, wherein the first differential section of the at least one RF block of the first differential RF path is symmetrical with the second differential section of the at least one RF block of the first differential RF path; and
a second differential RF path having at least one RF block, wherein the at least one RF block of the second differential RF path includes a first differential section and a second differential section, wherein the first differential section of the at least one RF block of the second differential RF path is symmetrical with the second differential section of the at least one RF block of the second differential RF path,
wherein the first and second half differential sections of the at least one RF block of the first differential RF path are symmetrically placed on at least one layer around the first and second half differential sections of the at least one RF block of the second differential RF path, wherein the first and second half differential sections of the at least one RF block of the second differential RF path are fabricated on the at least one layer.

2. The RF circuit of claim 1 further comprises:
a transformer operably coupled to convert differential signals from the first differential RF path into single-ended signals and to convert differential signals from the second differential RF path into single-ended signals.

3. The RF circuit of claim 1, wherein symmetry of the first and second differential sections of the first and second differential RF paths further comprises at least one of: an electrical symmetry and a physical symmetry.

4. The RF circuit of claim 1, wherein the at least one layer further comprises at least one of:
at least one metal layer of an integrated circuit; and
at least one trace layer of a printed circuit board.

5. The RF circuit of claim 1 further comprises:
matching circuit operably coupled to provide an impedance match between the first RF path and an antenna and to provide an impedance match between the second RF path and the antenna.

6. The RF circuit of claim 1 further comprises:
the at least one RF block of the first RF path includes a transmit filter module, a transmit mixing module, and a power amplifier interoperably coupled to convert outbound low intermediate frequency data into outbound differential RF signals; and
the at least one RF block of the second RF path includes a low noise amplifier, a receive mixing module, and a receive filter module interoperably coupled to convert inbound differential RF signals into inbound low intermediate frequency signals.

7. The RF circuit of claim 6 further comprises:
the transmit filter module including a first transmit filter section and a second transmit filter section;
the transmit mixing module including a first transmit mixing section and a second transmit mixing section;
the power amplifier including a first power amplifier section and a second power amplifier section;
the low noise amplifier including a first low noise amplifier section and a second low noise amplifier section;
the receive mixing module including a first receive mixing section and a second receive mixing section; and
the receive filter module including a first receive filter section and a second receive filter section.

8. A data circuit comprises:
a first differential data path having at least one data block, wherein the at least one data block of the first differential path includes a first differential section and a second differential section, wherein the first differential section of the at least one data block of the first differential data path is symmetrical with the second differential section of the at least one data block of the first differential data path; and
a second differential data path having at least one data block, wherein the at least one data block of the second differential data path includes a first differential section and a second differential section, wherein the first differential section of the at least one data block of the second differential data path is symmetrical with the second differential section of the at least one data block of the second differential data path,
wherein the first and second half differential sections of the at least one data block of the first differential data path are symmetrically placed on at least one layer around the first and second half differential sections of the at least one data block of the second differential data path, wherein the first and second half differential sections of the at least one data block of the second differential data path are fabricated on the at least one layer.

9. The data circuit of claim 8 further comprises:
a splitter operably coupled to split first differential signals of the first differential data path from second differential signals of the second differential data path.

10. The data circuit of claim 8, wherein symmetry of the first and second differential sections of the first and second differential data paths further comprises at least one of: an electrical symmetry and a physical symmetry.

11. The data circuit of claim 8, wherein the at least one layer further comprises at least one of:
at least one metal layer of an integrated circuit; and
at least one trace layer of a printed circuit board.

12. A radio frequency integrated circuit comprises:
a receiver section including a low noise amplifier, receiver mixing module, and receiver filtering module interoperably coupled to convert inbound radio frequency (RF) signals into inbound low intermediate frequency (IF) signals;
a transmitter section including a transmitter filtering module, a transmitter mixing module, and a power amplifier interoperably coupled to convert outbound low IF signals into outbound RF signals; and
a transformer balun operably coupled to the low noise amplifier and to the power amplifier, wherein the low noise amplifier includes a first differential section and a second differential section, wherein the first differential section of the low noise amplifier is symmetrical with the second differential section of the low noise amplifier,
wherein the power amplifier includes a first differential section and a second differential section, wherein the first differential section of the power amplifier is symmetrical with the second differential section of the power amplifier,
wherein the first and second differential sections of the low noise amplifier are symmetrically placed on at least one layer around the first and second half differential sections of the power amplifier for coupling the low noise amplifier and the power amplifier to the transformer balun, wherein the first and second half differential sections of the power amplifier are fabricated on the at least one layer.

13. The radio frequency integrated circuit of claim 12 further comprises:
the receiver mixing module includes a first differential section and a second differential section, wherein the first differential section of the receiver mixing module is symmetrical with the second differential section of the receiver mixing module,
wherein the transmitter mixing module includes a first differential section and a second differential section, wherein the first differential section of the transmitter mixing module is symmetrical with the second differential section of the transmitter mixing module,
wherein the first and second half differential sections of the receiver mixing module are symmetrically placed on the at least one layer around the first and second half differential sections of the transmitter mixing module, wherein the first and second half differential sections of the transmitter mixing module are fabricated on the at least one layer.

14. The radio frequency integrated circuit of claim 12 further comprises:
the receiver filtering module includes a first differential section and a second differential section, wherein the first differential section of the receiver filtering module is symmetrical with the second differential section of the receiver filtering module,
wherein the transmitter filtering module includes a first differential section and a second differential section, wherein the first differential section of the transmitter filtering module is symmetrical with the second differential section of the transmitter filtering module,
wherein the first and second half differential sections of the receiver filtering module are symmetrically placed on the at least one layer around the first and second half differential sections of the transmitter filtering module, wherein the first and second half differential sections of the transmitter filtering module are fabricated on the at least one layer.

* * * * *